(12) United States Patent
Morrison et al.

(10) Patent No.: US 6,912,781 B2
(45) Date of Patent: *Jul. 5, 2005

(54) METHOD OF MANUFACTURING ELECTRONIC PACKAGING DEVICE WITH INSERTABLE LEADS

(75) Inventors: Timothy J. Morrison, Oceanside, CA (US); Aurelio J. Gutierrez, Bonita, CA (US); Thomas Rascon, Temecula, CA (US)

(73) Assignee: Pulse Engineering, Inc., San Diego, CA (US)

(*) Notice: Subject to any disclaimer, the term of this patent is extended or adjusted under 35 U.S.C. 154(b) by 234 days.

This patent is subject to a terminal disclaimer.

(21) Appl. No.: 10/242,066

(22) Filed: Sep. 11, 2002

(65) Prior Publication Data

US 2003/0009880 A1 Jan. 16, 2003

Related U.S. Application Data

(62) Division of application No. 09/773,134, filed on Jan. 31, 2001, now Pat. No. 6,593,840.
(60) Provisional application No. 60/179,300, filed on Jan. 31, 2000.

(51) Int. Cl.[7] .......................... H01R 43/00; H05K 13/00
(52) U.S. Cl. .......................... 29/854; 29/592.1; 29/602; 29/827; 29/855; 29/860; 336/90; 336/192; 361/728; 361/773

(58) Field of Search .................. 29/854, 592.1, 29/602.1, 827, 855, 860; 336/90, 192; 361/728, 773

(56) References Cited

U.S. PATENT DOCUMENTS

| | | | |
|---|---|---|---|
| 3,721,747 A | 3/1973 | Renskers | 361/392 |
| 5,008,776 A | 4/1991 | Queyssac | 361/392 |
| 5,015,981 A | 5/1991 | Lint et al. | 336/65 |
| 5,977,860 A * | 11/1999 | Ulm et al. | 337/297 |
| 6,005,463 A | 12/1999 | Lint et al. | 336/65 |
| 6,344,785 B1 | 2/2002 | Lu et al. | 336/96 |
| 6,593,840 B2 * | 7/2003 | Morrison et al. | 336/192 |
| 6,691,398 B2 * | 2/2004 | Gutierrez | 29/592.1 |

* cited by examiner

*Primary Examiner*—Carl J. Arbes
*Assistant Examiner*—Tim Phan
(74) *Attorney, Agent, or Firm*—Knobbe, Martens, Olson & Bear, LLP

(57) ABSTRACT

A device for electrically interconnecting and packaging electronic components. A non-conducting base member having a component recess and a set of specially shaped lead channels formed therein is provided. At least one electronic component is disposed within the recess, and the conductors of the component are routed through the lead channels. A set of insertable lead terminals, adapted to cooperate with the specially shaped lead channels, are received and captured within the lead channels, thereby forming an electrical connection between the lead terminals and the conductors of the electronic component(s). A method of fabricating the device is also disclosed.

18 Claims, 11 Drawing Sheets

METHOD OF MANUFACTURING ELECTRONIC PACKAGING DEVICE WITH INSERTABLE LEADS

RELATED APPLICATIONS

This application is a divisional of, and incorporates by reference in its entirety, U.S. patent application entitled "ELECTRONIC PACKAGING DEVICE WITH INSERTABLE LEADS AND METHOD OF MANUFACTURING", filed on Jan. 31, 2001, application Ser. No. 09/773,134, now U.S. Pat. No. 6,593,840, which claims the benefit of provisional application Ser. No. 60/179,300, filed Jan. 31, 2000.

BACKGROUND OF THE INVENTION

1. Field of the Invention

The invention relates generally to non-semiconductor electrical and electronic components used in printed circuit board applications and particularly to an improved package and method of packaging miniature electronic components.

2. Description of Related Technology

Dual in-line chip carrier packages (DIPs) are well known in the field of electronics. A common example of a DIP is an integrated circuit, which is typically bonded to a ceramic carrier and electrically connected to a lead frame providing opposed rows of parallel electrical leads. The integrated circuit and ceramic carrier are normally encased in a black, rectangular plastic housing from which the leads extend.

The continuing miniaturization of electrical and electronic components and high density mounting thereof have created increasing challenges relating to electrical isolation and mechanical interconnection. In particular, substantial difficulty exists in establishing reliable and efficient connections between fine gauge (AWG 24 to AWG 50) copper wire leads associated with various electronic components within a given DIP. One particularly useful prior art method of packaging and connecting element leads to the lead frame terminals or, of interconnecting the leads of two or more electronic components, is disclosed in U.S. Pat. No. 5,015,981, which is illustrated herein in FIG. 1. Commonly known as "interlock base" technology, this method involves routing the wire lead(s) 2 to an unused lead frame slot or channel 3 located at the edge of the non-conducting base member 10, as shown in FIGS. 1 and 2. Each of these channels 3 is designed to receive a single conductive lead frame terminal 4, which when assembled asserts an inward bias on the package thereby forcing contact between the conductive terminals 4 of the lead frame and the electronic component lead(s) 2. This method typically utilizes a locking mechanism, such as a small tab 12 or extension on the four corner lead terminals 14, 15, 16, 17, which locks into a plastic protrusion 18 of similar dimensions using the spring tension associated with the individual lead terminals 4 of the lead frame 34. The device is ultimately encapsulated within an over-molding to complete the package.

Disabilities associated with aforementioned interlock base design include the requirement to encapsulate or overmold the package, which adds labor and cost to the product, as well as the production of unwanted mechanical and/or thermal stresses upon the electronic components and their associated conductors contained within the package due to the encapsulant. Furthermore, the electrical performance of the device may be less than that of a comparable "open" design as described below, due again primarily to the presence of the encapsulant.

A second approach to miniature electronic device packaging has been the so-called "open header" design and is illustrated in FIG. 4. In this design, the individual lead terminals 50 of the lead frame are molded directly into a non-conductive base member 52 when the latter is formed. The leads each include a terminal pin 54 which projects from the base 52, thereby allowing the conductors 56 of the electronic component(s) 58 of the device to be routed to and wound around (or otherwise bonded to) the terminal pins 54 as required. No encapsulation or over-molding of the assembled device is performed (hence the name "open", referring to the open bottom of the package.)

However, the aforementioned open header design suffers from various disabilities as well. First, excess material or "flash" associated with the molding of the non-conducting base member is difficult to trim due to the presence of the molded-in lead frame and terminal pins as shown in FIGS. 3 and 4. Specifically, prior art techniques of de-flashing, which typically comprise the use of sand, polymers, or another particulate abrasive sprayed at high pressure to mechanically remove the flash, undesirably damage or affect other nearby components such as the lead frame and terminal pins, thereby necessitating re-plating thereof. Obviously, such re-plating introduces additional cost into the manufacturing process.

Second, the use of the aforementioned abrasives tends to remove portions of the surface layer of the molded base member in areas adjacent to the lead frame. This is significant since in many typical constructions, glass or other fibers are used to strengthen or reinforce the polymer used to form the base element. Such removal of the surface layer allows for unwanted absorption by the exposed fiber matrix of impurities and/or moisture which can affect both the mechanical and electrical properties of the base member and the package as a whole, as well as its longevity. Such removal also detracts from the esthetics of the package, giving it an unfinished or damaged appearance.

Lastly, prior art methods of installing the lead frame on the base member and bonding the conductors of the packaged components to the lead frame make trimming of the free ends of the conductors after bonding difficult, in that they are not necessarily uniform, and do not provide a surface which readily permits such trimming.

Based on the foregoing, it would be highly desirable to provide an improved apparatus and method for connecting a lead frame to a package of any size such that the molded package could be easily de-flashed and prepared without damaging or requiring additional processing of the base member or related components such as the lead frame. Additionally, such an improved apparatus and method would facilitate trimming of the free conductor ends, thereby reducing process labor and associated cost. Ideally, no encapsulation of the device would be required, thereby further reducing manufacturing costs, and eliminating the possibility of deleterious effects on device performance and longevity associated with the use of an encapsulant.

SUMMARY OF THE INVENTION

The invention satisfies the aforementioned needs by providing an improved electronic component package and interconnect device having a plurality of specially shaped insertable leads and corresponding lead channels which receive the leads.

In a first aspect of the invention, an improved electronic device is disclosed which includes a base body with at least one side wall which is fabricated from non-conductive material and includes at least one electronic component recess and a plurality of specially shaped lead channels formed in the at least one side wall. The lead channels have at least one retention element comprising at least a projection that reduces the cross-sectional area of the lead channel. The device also includes at least one electronic component disposed in the recess, with the electronic component having a plurality of lead wires, with at least one of the lead wires extending within one of the lead channels. The lead channels are adapted to receive respective ones of insertable lead terminals, wherein each of the lead terminals comprises a clip region with substantially a U-shape, this shape enabling the clip region to frictionally connect the lead terminal to the respective lead channel and forming a conductive contact with one of the lead wires.

In a second aspect of the invention, an improved method for fabricating the aforementioned device is disclosed. In one embodiment of the method, the base member is formed from a non-conductive material using a transfer molding process. The electronic component(s) are also formed. The molded base member is de-flashed using a de-flashing tool while the lead terminals are formed and pre-shaped for simultaneous insertion into the lead channels of the base member. After de-flashing, the electronic components are placed within the base member, and the conductors routed into the lead channels thereof Next, the lead terminals are inserted into the lead channels such that the terminals form an electrical contact with the conductors in the respective channels, and the contact is bonded using dip soldering or another bonding process. Lastly, the die bar or carrier joining the lead terminals is trimmed, and any excess conductor length is trimmed as well. The device may also optionally be encapsulated in a polymer or other over-molding if desired.

These and other objects and features of the invention will become more fully apparent from the following description and appended claims taken in conjunction with the following drawings.

BRIEF DESCRIPTION OF THE DRAWINGS

FIG. 5b is a bottom perspective view of the device of FIG. 5a.

FIG. 6 is side plan view of the lead terminals of the embodiment of FIG. 5a.

FIG. 8 is a perspective cross-sectional view of the base member of FIG. 5a taken along line 8—8 of FIG. 5a.

DETAILED DESCRIPTION OF THE INVENTION

Reference is now made to the drawings wherein like numerals refer to like parts throughout.

Figure 1:
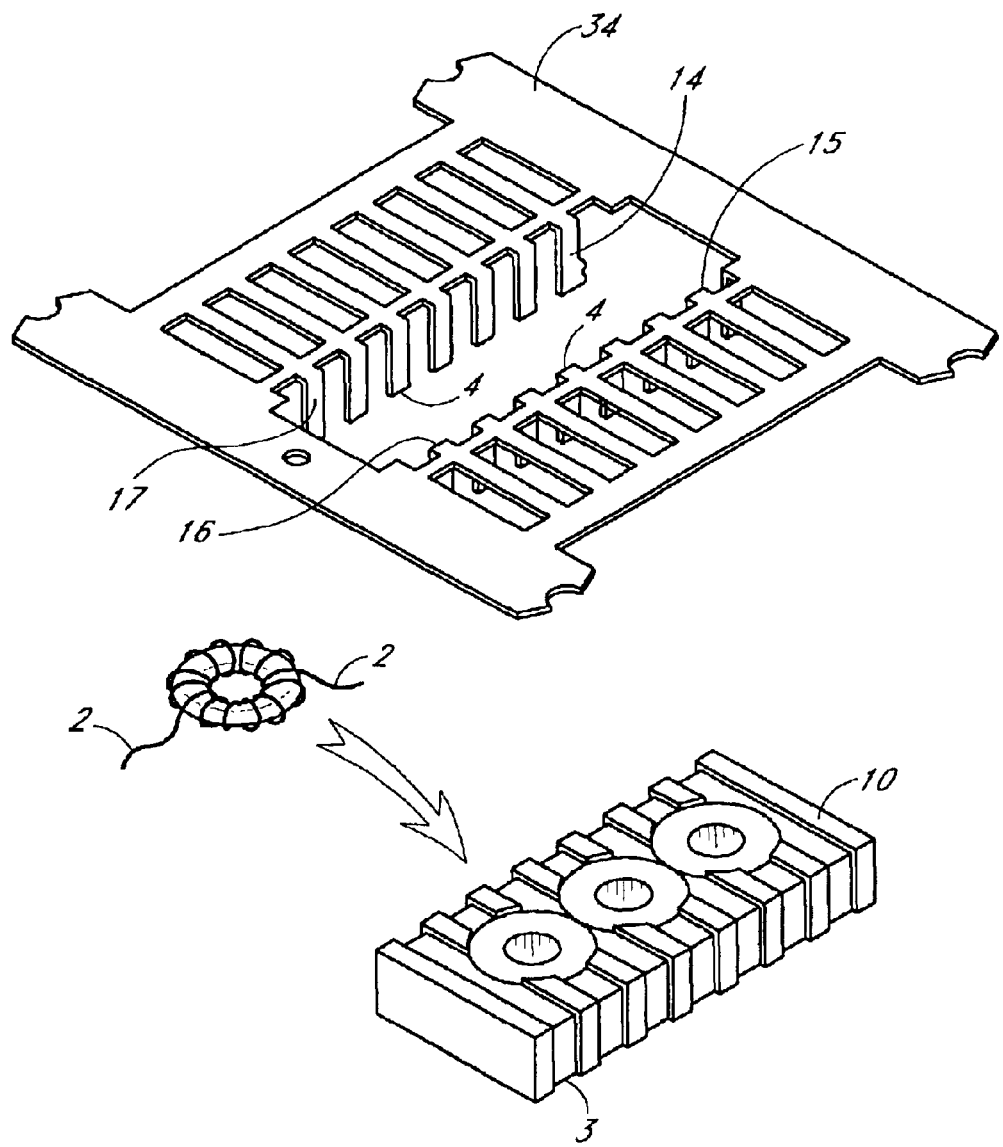
FIG. 1 is a perspective view of a prior art microelectronic packaging device illustrating the relationship between the lead terminals and lead channels.
Figure 2:
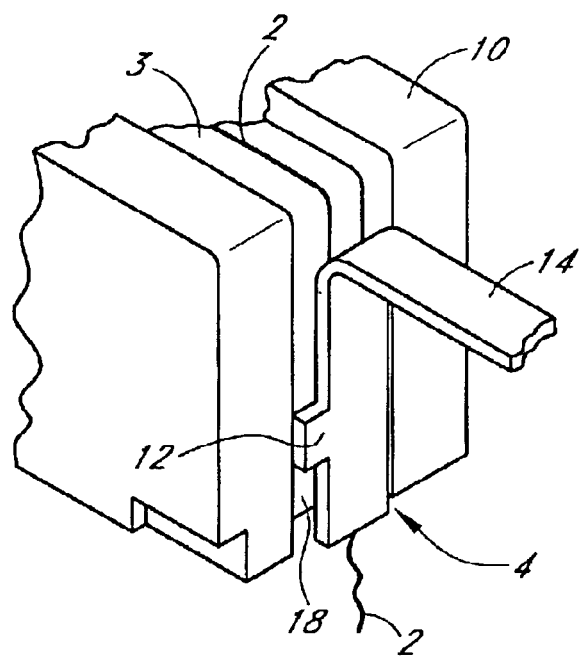
FIG. 2 is perspective view of the prior art device of FIG. 1, illustrating the electrical interconnection between the component lead and lead terminals within a single lead channel, and the locking mechanism associated therewith.
Figure 4:
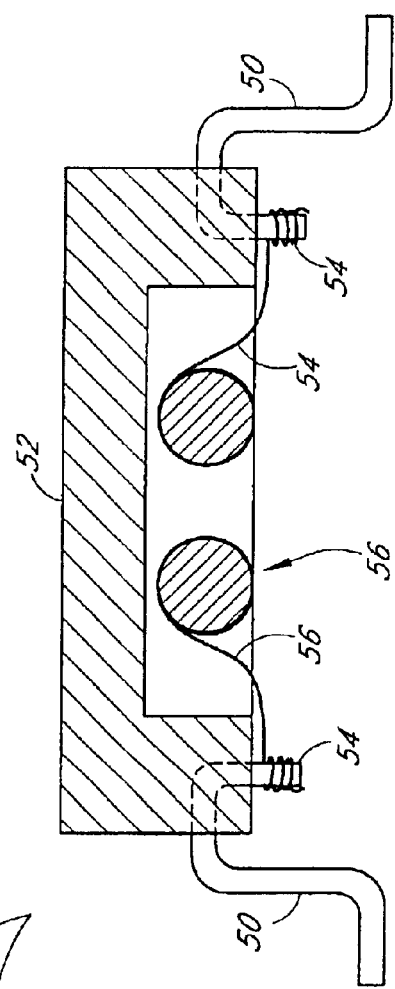
FIG. 4 is a e cross-sectional view of the open header package of FIG. 3 taken along line 4—4 of FIG. 3.
Figure 3:
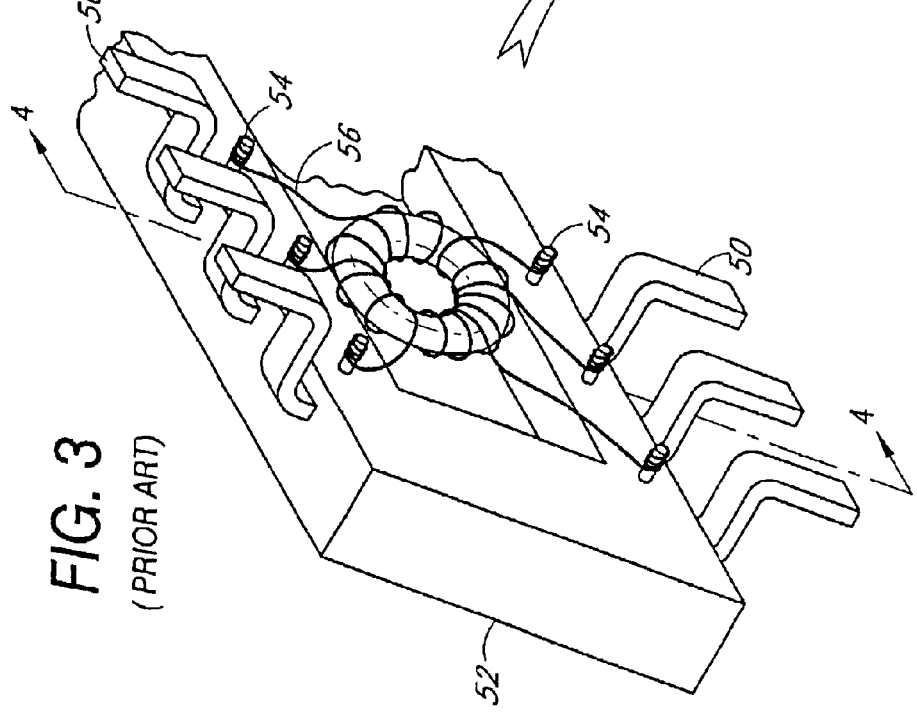
FIG. 3 is a perspective view of a typical prior art open header package design.
Figure 5A:
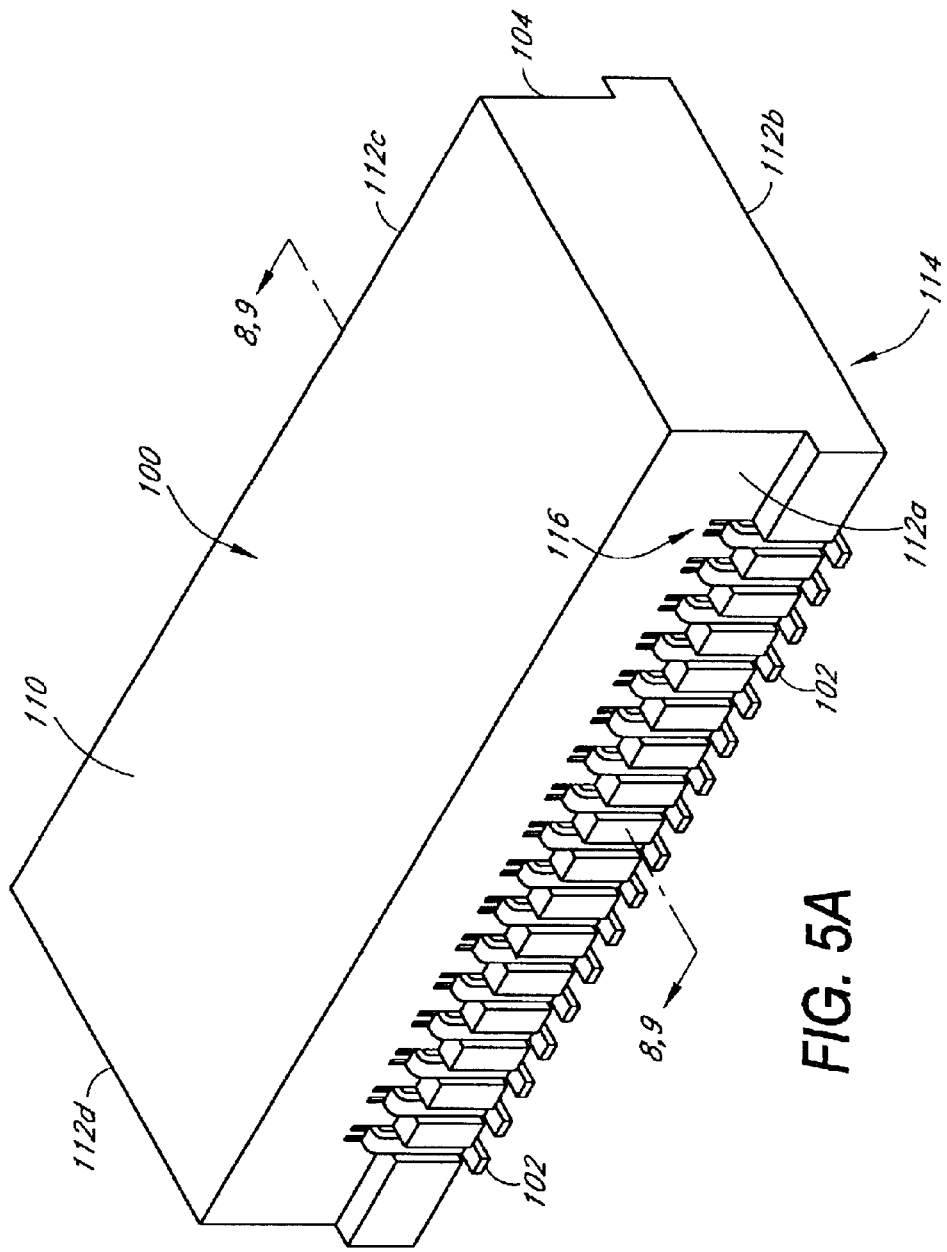
FIG. 5a is a perspective view of one exemplary embodiment of the base member and associated lead terminals of the invention
Figure 5B:
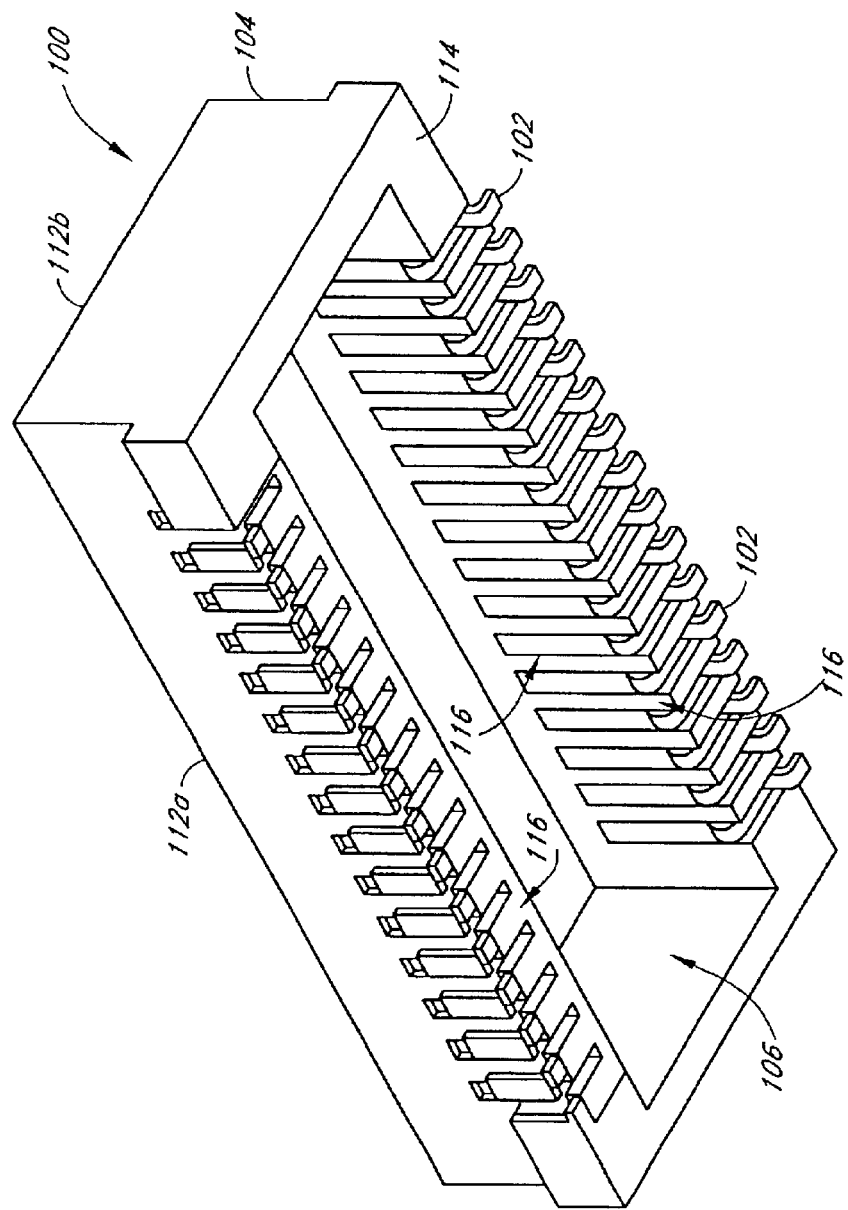

FIGS. 5a and 5b illustrate a first embodiment of the base member 100 with a set of lead terminals 102 according to the invention. As illustrated in the aforementioned figures, the base member 100 is comprised generally of a three-dimensional base body 104 having one or more electronic component recesses 106 formed at least partly therein. The body 104 includes a top wall 110, side walls 112a–112d, and a bottom wall 114. The body 104 also includes a plurality of sets of lead channels 116 formed vertically within the side walls 112 of the body 104 as described in greater detail below, although other orientations may be used. The base body 104 is ideally fabricated from a non-conductive material such as a liquid crystal polymer using an injection molding process or alternatively a transfer molding process, although other materials and processes may be used.

The electronic component recesses 106 are shaped to receive any one of a variety of different electronic components 107 (not shown), such as toroidal induction coils. While the discussion presented herein is specific to the illustrated toroidal induction coils, it can be appreciated that a variety of different electronic components may be used in conjunction with the invention with equal success.

The lead channels 116 are disposed on the opposing, elongate side walls 112a, 112c of the base body, and oriented in a vertical direction such that the channels 116 run generally from the bottom wall 114 toward the top wall 110, and are parallel to one another. This orientation facilitates the routing of wire leads associated with the electronic components disposed in the recesses 106 into the lead channels 116 when the packaging device is assembled as will be discussed below.

Figure 6:
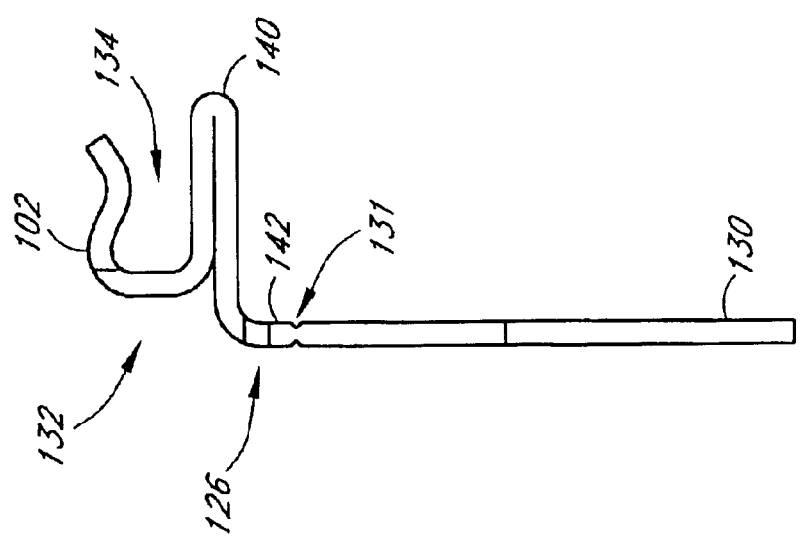

Referring now to FIG. 6, the structure of one exemplary embodiment of the lead terminals 102 of the invention is described. In the illustrated embodiment, the lead terminals 102 have a generally rectangular cross-section, although other cross-sectional shapes can be used.

Each lead terminal 102 is formed to its final desired shape by bending the distal region 132 of each lead terminal 102 such that a clip-like portion 134 is formed. This clip-like portion 134 is used to provide mechanical attachment to the lead channel 116 as discussed in greater detail below. The bent distal region 132 also comprises a counter-bend 140. This construction helps provide some degree of mechanical resilience or "spring" to the lead terminal 102 such that the compression of the lead terminal 102 by various portions of the base member 100 as described below when the former is inserted into the latter assists in maintaining friction between the lead terminal 102 and base member 100. This friction between the lead terminal 102 and base member 100 helps frustrate the removal of the lead terminal 102 from the base member 100 even when there is no use of adhesives or fasteners, which is desirable.

Figure 7:
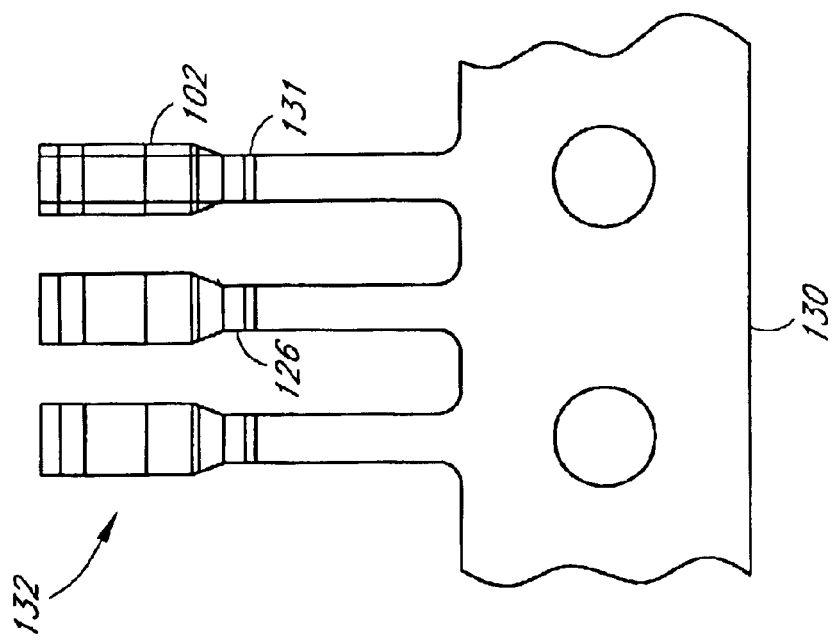
FIG. 7 is a top plan view of the lead terminals of the embodiment of FIG. 5a prior to detachment from the die bar.

As shown in FIG. 7, the lead terminals 102 are initially part of a larger die bar assembly 130 before being separated therefrom during manufacturing. The use of a die bar assembly 130 allows all of the lead terminals 102 to be formed and placed within their respective lead channels 116 in single processing steps, as is described further below. The lead terminals 102 are attached to the die bar 130 at one end 126, and are generally coplanar with each other to facilitate easy insertion into the base member 100 as described further below. The lead terminals 102 are scored or notched at a point 131 near the bent region 132 so as to permit easy separation of the lead terminal 102 from the die bar assembly 130. A contact end 142 (i.e., after separation of the lead terminal 102 from the die bar assembly 130 at the score 131) contacts the contact pads or traces on the PCB (not shown) or other substrate to which the device is mounted. The die bar 130 (and attached lead terminals 102) of the present embodiment are fabricated from an electrically conductive metal alloy, although other materials may conceivably be used.

Figure 8:
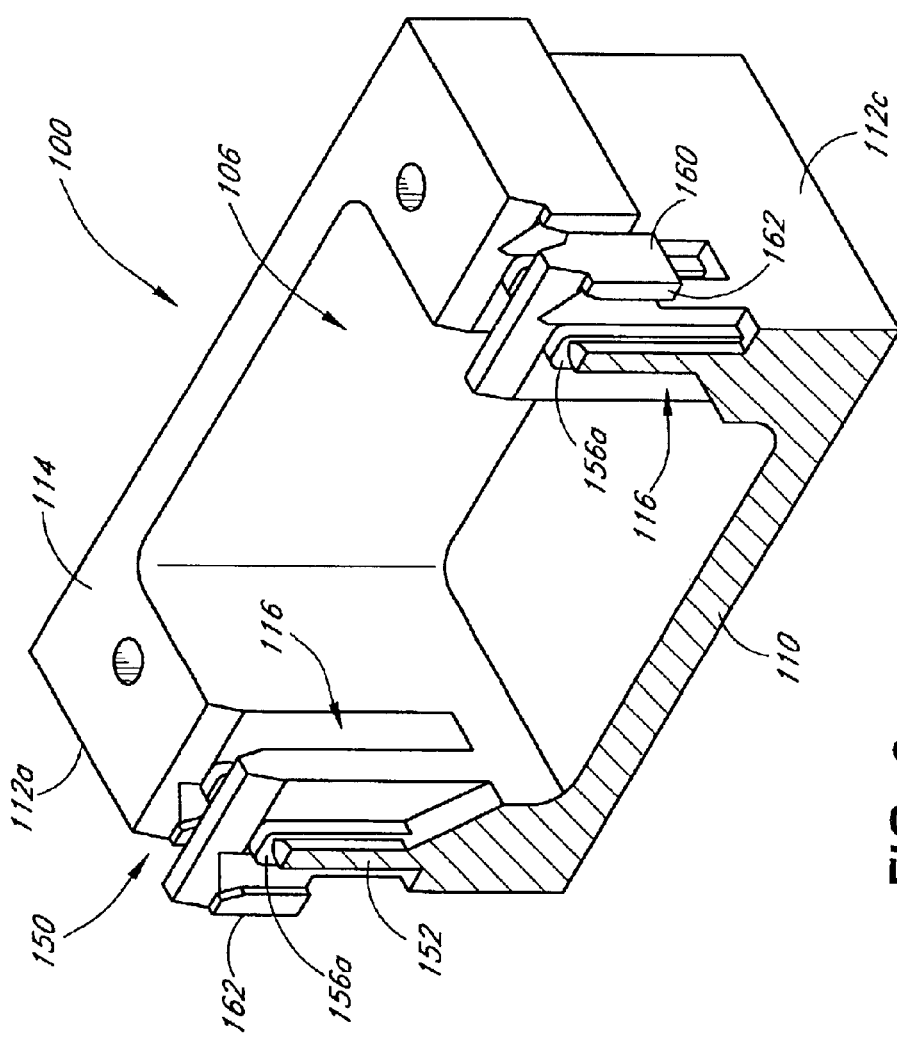

Referring now to FIG. 8, the construction of the lead channels 116 within the base member 100 is described. Each lead channel 116 comprises a longitudinal aperture 150 which is vertically oriented with respect to the side walls 112 of the base member 100. The channels 116 further comprise a wall element 152 which spans each aperture 150 transversely to a predetermined height within the aperture 150 such that a wall or barrier between the recess 106 and the region outside of the base member 100 is formed. Ridge elements 156a, 156b (not shown) are formed over each of these wall elements 152 at the outer edges of the aperture 150 and in a direction parallel to the longitudinal axis of the aperture 150 such that the ridge elements 156 are roughly coextensive with the length of the outer surface of the wall element 152, both inside and outside of the device. Ridge elements 156a and 156b create a chamfered region adjacent to the wall element 152 that facilitates the routing of lead wires 109 as will be discussed below.

A retainer 160 is formed adjacent the bottom surface of the side wall 112 between the lead channels 116 and connected to the wall elements 152. The retainer element 160 further includes lateral projections 162 which help capture and retain the lead terminals 102 (not shown) within the lead channels 116 by reducing the effective cross-sectional area of each lead channel 116 as viewed from the outside of the base member 100. Each retainer 160 with lateral projections 162 forms a "T" shape projecting outward from the base member 100. Hence, the retainer 160 with lateral projections 162, lead channels 116, wall element 152, and ridge elements 156 cooperate to receive the clip-like portion 134 of the lead terminals 102 and rigidly capture it within the base member 100.

Figure 9:
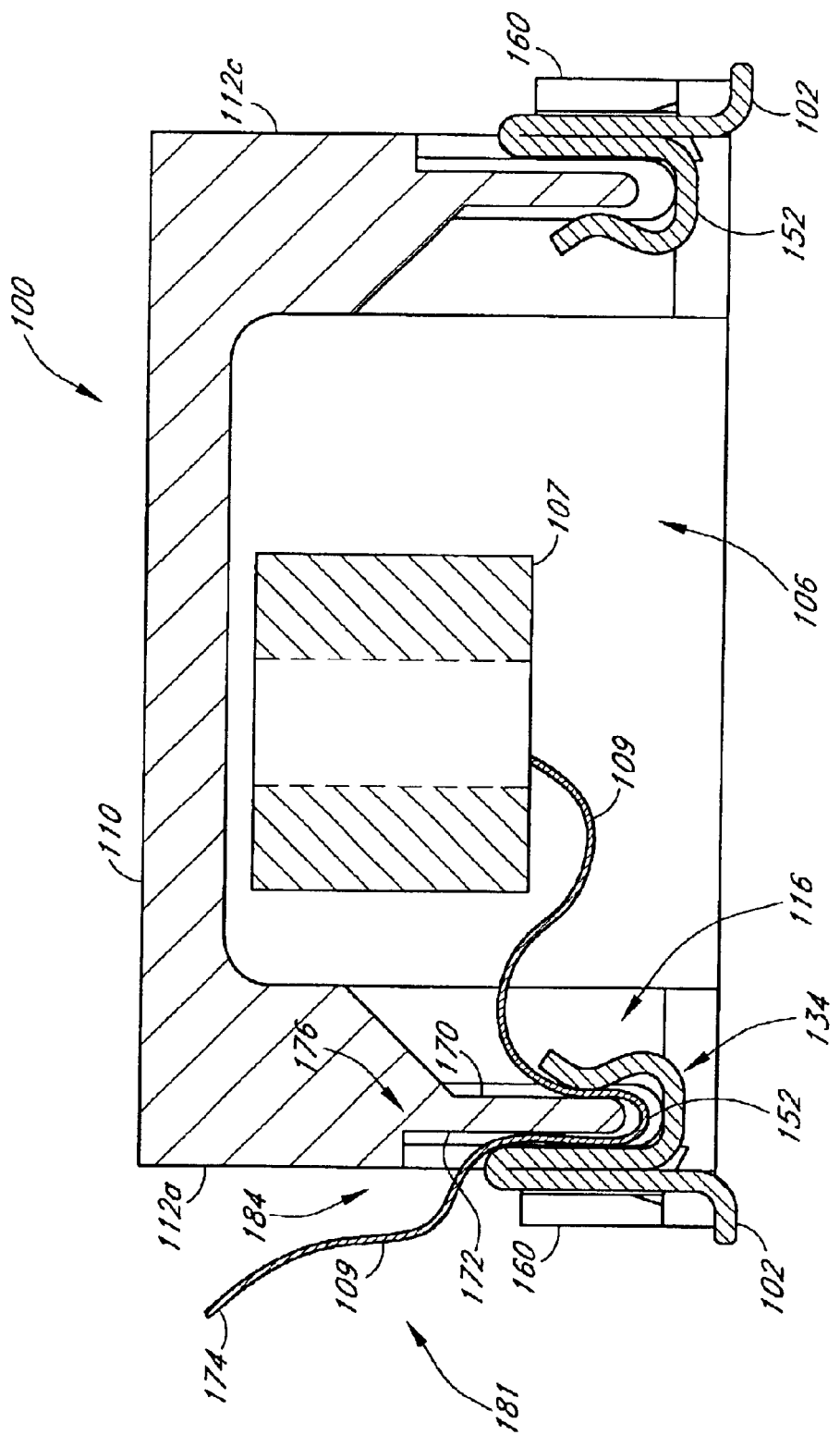
FIG. 9 is a side cross-sectional view of the assembled device, taken along line 9—9 of FIG. 5a, illustrating the placement of the electronic components and associated conductors with respect to the base member and lead terminals

As illustrated in FIG. 9, the lead wires 109 associated with the electronic component 107 are routed in the lead channels 116 such that each lead wire 109 runs up one side 170 of the wall element 152 and down the opposing side 172 substantially between the two ridge elements 156a, 156b (not shown), and with the distal (untrimmed) end 174 of the lead wire 109 emerging from the upper end 176 of the lead channel 116. In this fashion, the lead wire 109 is firmly held within the lead channel 116 and securely contacted by the clip-like portion 134 of the respective lead terminal 102 when the latter is installed into the base member 100, thereby forming an electrical contact. Note that the lead terminals 102 may be bonded in place if desired, held by friction against the base member 100 such as by forming the retainer 160 in a tapered shape, or attached using any other means available.

It is also noted that the cooperation of the side walls 112a, 112c of the base member 100, the inserted lead terminals 102, and the lead channels 116 form a convenient location 184 on the outer surface of the base member 100 at which excess lead wire 109 associated with the electronic components 107 may be trimmed during manufacturing.

While the aforementioned description has been provided in terms of the exemplary embodiment illustrated in FIGS. 5a–9, it will be recognized that numerous other configurations are possible, depending on the needs of the user. For example, the base member 100 and associated retainer 160, aperture 150, wall member 152, and ridges 156 could readily be adapted to receive lead terminals having a circular or oval cross-section. Alternatively, the clip-like portion 134 could be replaced with a simple U-shaped bend with counter-bend (not shown) which corresponds closely with the cross-section of the wall member 152, yet which has sufficient friction to assist in retaining the lead terminal 102 mounted thereon. As yet another alternative, the lead terminals could be formed such that the contact region 142 of each lead terminal is disposed at the top of the package (i.e., the package is adapted to be mounted inverted, or recess-up, on the PCB). As even a further alternative, multi-part lead terminals could be used in conjunction with the base member. Other alternative configurations are possible consistent with the concept of inserting captured lead terminals within lead channels of a base member consistent with the invention, such alternative configurations being understood by those of skill in the art.

Figure 10A:
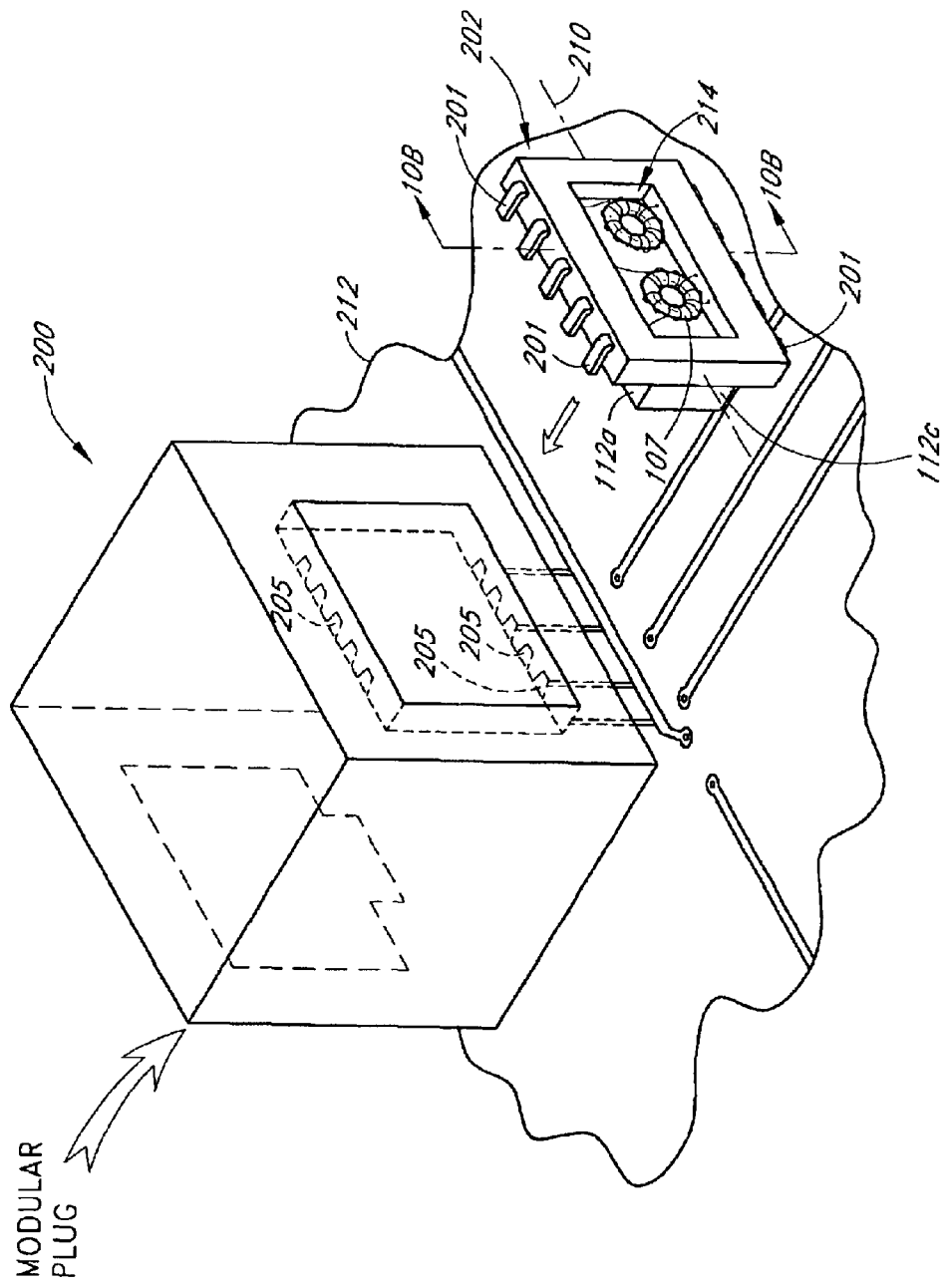
FIG. 10a is an exploded perspective view of a second embodiment of the device of the invention, adapted for use in an RJ style connector.
Figure 10B:
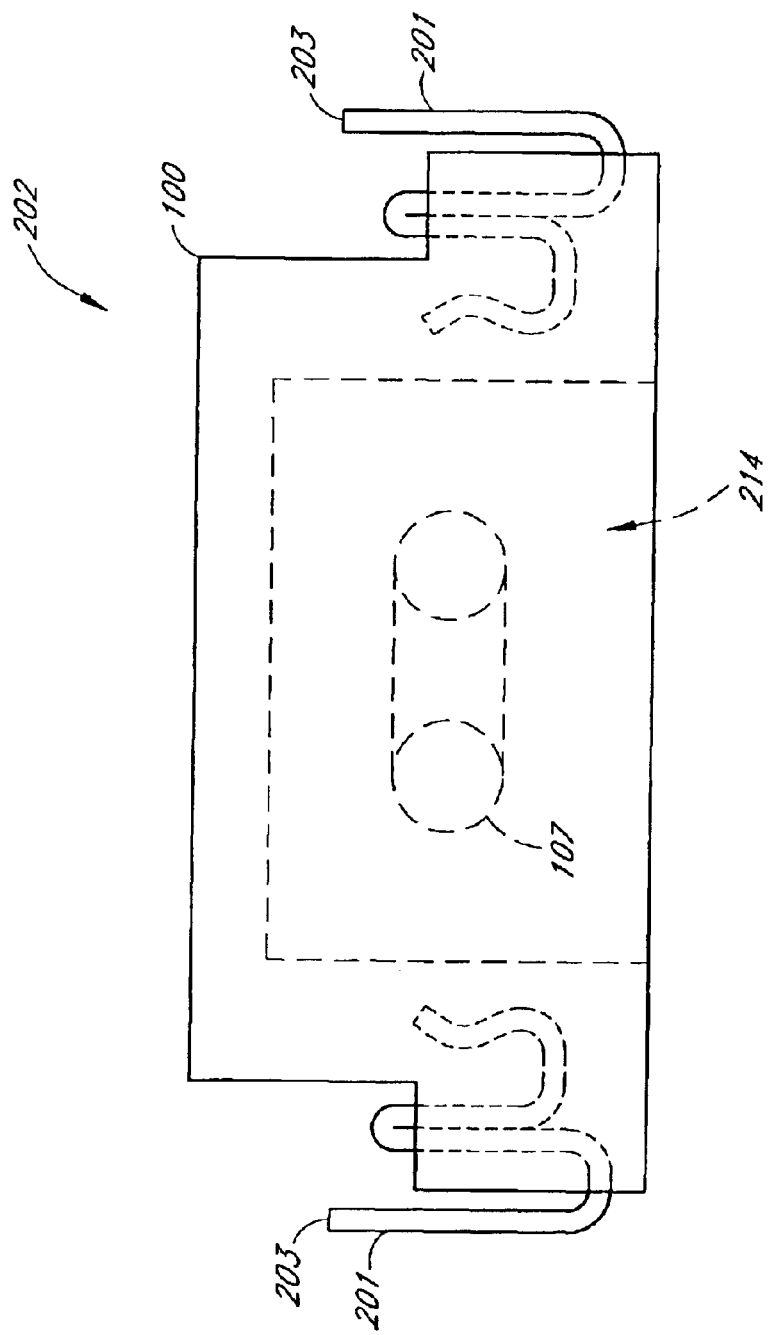
FIG. 10b is a side cross-sectional view of the device of FIG. 10a taken along line 10b—10b.

Referring now to FIGS. 10a and 10b, an alternative embodiment of the device of the invention is described. In this embodiment, the device is adapted to be received within an RJ type electronic connector 200 of the type well known in the telecommunications art. The lead terminals 201 of this embodiment of the device package 202 are deflected at their ends 203 to be more co-linear with the vertical side walls 112a, 112c of the base member 100, thereby facilitating easy insertion of the device into the connector 200 as shown in FIG. 10a. The spring force associated with the compression of the ends 203 of the lead terminals 201 upon insertion assists in maintaining the device firmly within the recess. This also allows the device to be "plug-in" rather than requiring a solder or other joint to make the electrical connection between the lead terminals 201 and the terminals 205 inside the connector.

Note also that the orientation of the device within the connector may be altered from that shown in FIG. 10a. For example, the longitudinal dimension 210 of the package 202 may be made normal to the plane of the circuit board (PCB) 212 so as to minimize connector footprint. Alternatively, the lead terminals 201 may be formed in the opposite direction of that shown, such that the device can be plugged into the connector 200 with the electronic component recess 214 facing inward toward the connector as opposed to outward as in FIG. 10a. As yet another alternative, the lead terminals 201 of this or other embodiments may be notched or otherwise adapted to receive component conductors wound around the terminals 201 as is well known in the art. Many other such alternative embodiments are possible, all considered to be within the scope of the invention disclosed herein.

Method of Manufacturing

Figure 11:
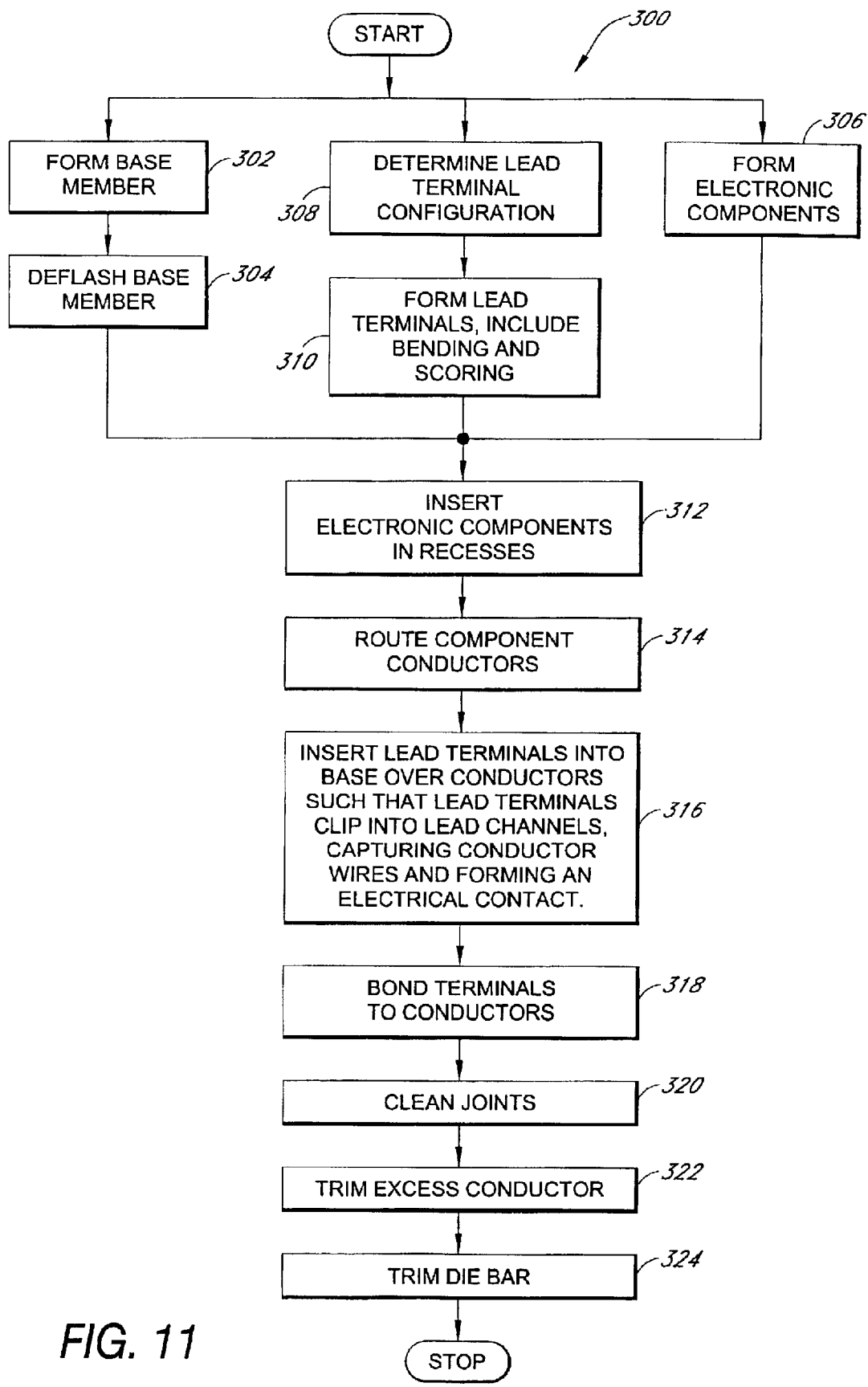
FIG. 11 is a logical flow chart illustrating one exemplary embodiment of a method of manufacturing the electronic device of the invention.

The method of assembling the exemplary electronic packaging device illustrated in FIGS. 5a–9 herein is now described with reference to FIG. 11. In the first process step 302 of the method 300, the base member 100 is formed using processes well understood in the art. For example, the base member 100 may be formed using an injection or transfer molding process. Many different methods of forming these components are known and may be used with equal success.

Next, in step 304, the base member 100 is de-flashed after molding using a de-flashing tool of the type well known in the art. Such de-flashing may be done manually (e.g., by hand) or automatically as desired.

In step 306, the electronic component(s) 107 are formed using processes well understood in the art. For example, the cores of the toroidal electronic components formed from a metal alloy suspended in a ceramic binder using a sintering and firing process. Many different methods of forming these components are known and may be used with equal success.

In step 308, the number of lead terminals 102 required for use in the device is determined based on the size and properties of the base member 100 molded in step 302, and the appropriate number of leads partitioned. Note that while the method described herein relates to the use of a plurality of lead terminals 102 being connected to the die bar 130 (prior to separation therefrom), the lead terminals may be formed and/or placed within the base member 100 individually or in subsets of any desired size. In step 310, the lead terminals 102 are formed and scored as previously described to form, inter alia, the clip-like portion 134 which permits attachment to the base member 100.

In step 312, the electronic component(s) 107 are placed within the recesses 106 formed within the base member 100. A silicone gel or other adhesive of a type well known in the electronic arts may optionally be used to aid in retaining the components 107 in their recesses 106 during subsequent processing. The lead wires 109 of the electronic components 107 are then routed into the lead channels 116 in the next step 314, as illustrated in FIG. 9.

In the next step 316, the formed lead terminals 102 with die bar 130 are inserted into the lead channels 116 of the base member 100 in the proper orientation, and the lead terminals 102 are captured within their respective lead channels 116 by, inter alia, the action of the clip-like portion 134 of each lead terminal 102 and the cooperation of other components associated with the base member 100 (including the retainer 160 and lateral projections 162) as previously described. When the lead terminals 102 are captured within the lead channels 116 of the base member 100, the electrical lead wires 109 of the electronic components 107 are captured as well, thereby forming an electrical contact between each routed conductor and its respective lead terminal 102. The lead terminals 102 and the conductors are then optionally bonded, preferably such as by a dip soldering process, in step 318. It will be recognized, however, that other types of bonding including adhesives, crimp bonds, conductor winding, and/or fusion with laser energy may be substituted.

When the aforementioned solder process is completed, the flux is then optionally cleaned with an isopropyl alcohol using an ultrasonic cleaner or comparable means per step 320. The excess portions 181 of the lead wires 109 are then trimmed at the previously identified locations 184 as necessary in step 322. By virtue of each of the plurality of trimming locations 184 being aligned along the side walls of the base member 100, trimming of all of the lead wires 109 is readily performed simultaneously. Lastly, in step 324. The lead terminals 102 are severed from the die bar 130 at the score point 131 to form the contact regions 142 which mate with the PCB or other substrate.

It will be recognized that while the aforementioned method 300 is described in terms of a specific sequence of steps, the order of certain of these steps may be permuted if desired. For example, while the method 300 of FIG. 11 first forms and de-flashes the base member 100 prior to forming the lead terminals 102, the order of these two operations may be reversed. Similarly, the formation of the base member, lead terminals, and electronic components may occur either in series, parallel, or any combination thereof. Additionally, it is noted that other process steps may be added, such as for inspection and/or testing of certain components, and other steps optionally deleted (such as those relating bonding the lead wires 109 and lead terminals 102 together). Many such permutations and combinations are possible, all being considered within the scope of the present invention.

While the above detailed description has shown, described, and pointed out the fundamental novel features of the invention as applied to various embodiments, it will be understood that various omissions, substitutions, and changes in the form and details of the device or process illustrated may be made by those skilled in the art without departing from the spirit or essential characteristics of the invention. The described embodiments are to be considered in all respects only as illustrative and not restrictive. The scope of the invention is, therefore, indicated by the appended claims rather than by the foregoing description. All changes which come within the meaning and range of equivalence of the claims are to be embraced within their scope.

What is claimed is:

1. A method of manufacturing an electronic device, comprising:
   forming a three-dimensional base member having at least one electronic component recess and a plurality of lead channels, said lead channels having a first shape;
   forming an electronic component having at least one wire lead;
   forming a plurality of lead terminals, said lead terminals having a second shape adapted to cooperate with said first shape of said lead channels;
   disposing said electronic component in said recess;
   routing at least one of said wire leads into at least one of said lead channels;
   mating said lead terminals within said lead channels, such that said first shape cooperates with said second shape to restrict the movement of said lead terminals within said lead channels.

2. The method of claim 1, wherein the acts of forming a plurality of lead terminals comprises the act of forming a unitary lead frame having said plurality of lead terminals disposed thereon.

3. The method of claim 2, wherein the act of forming said lead frame comprises the act of stamping said lead frame from a sheet of metal.

4. The method of claim 3, wherein the act of mating said lead terminals and said lead channels is performed while said lead terminals are disposed on said lead frame.

5. The method of claim 2, further comprising separating said lead terminals from said lead frame.

6. The method of claim 2, wherein said clip region is formed by a substantially U-shape bend in said lead terminal.

7. The method of claim 2, wherein at least one of said lead terminals secures at least one wire lead in the respective lead channel.

8. The method of claim 1, further comprising the act of exposing at least a portion of said electronic device to solder in order to bond at least some of said lead terminals to said wire leads of said electronic component.

9. The method of claim 1, further comprising encapsulating at least a portion of said electronic device using a molding process.

10. The method of claim 1, wherein each of said lead terminals comprises a clip region, said clip region forming a shape enabling said clip region to frictionally connect said lead terminal to the respective lead channel.

11. The method of claim 1, wherein each retention element comprises at least one projection, said projection reducing the cross-sectional area of the respective lead channel.

12. The method of claim 1, wherein said base body further defines at least one chamfered notch within said base body, said at least one chamfered notch forming a passage between said recess in said base body and an outside of said base body, said chamfered notch being adapted to receive at least one of said wire leads.

13. The method of claim 1, wherein said base body and said at least one electronic component are encapsulated in a non-conductive material.

14. The method of claim 1, wherein said base body is formed from a high temperature liquid crystal polymer.

15. The method of claim 14, wherein said base body comprises a generally rectangular box-like form.

16. In an electronic device, a method of forming an electrical contact between an electrical component, which is housed in a base body, and a terminal lead that extends out of said base body, comprising:

forming a lead channel in an outside wall of said base body;

inserting said electronic device in a recess of said base body with at least one wire lead from said electronic device extending from said recess;

positioning a portion of said wire lead into said lead channel;

forming a clip-like portion on said terminal lead by bending an end of said terminal lead in a U-shape;

retaining said terminal lead onto said lead channel such that said clip-like portion of said terminal lead holds said terminal lead to said outside wall in said lead channel, whereby said lead wire is impinged between said lead terminal and said outside wall of said base body.

17. A method of connecting a wire lead to a terminal lead in an electronic package, comprising:

forming a lead channel, wherein said lead channel is generally elongated and has first and second elongated and opposing sides, and having an end connecting said first and second sides;

forming an end of said lead terminal into a clip-like portion;

placing at least a portion of said lead wire along said first side and around said end and along said second end of said lead channel;

retaining said lead wire against said lead channel by pushing said clip-like portion of said lead terminal over said lead wire and said end of said lead channel, thereby retaining said lead wire in said lead channel.

18. The method of claim 17, further comprising:

increasing a retention capability of said clip end by forming a first shape on said clip end and a corresponding second shape in said lead channel, wherein said first shape engages with said second shape during said act of clipping.

* * * * *